(12) United States Patent
Yang et al.

(10) Patent No.: US 10,179,878 B2
(45) Date of Patent: Jan. 15, 2019

(54) WET ETCH CHEMISTRY FOR SELECTIVE SILICON ETCH

(71) Applicant: Taiwan Semiconductor Manufacturing, Co., Ltd., Hsinchu (TW)

(72) Inventors: Neng-Jye Yang, Hsinchu (TW); Kuo Bin Huang, Jhubei (TW); Ming-Hsi Yeh, Hsinchu (TW); Shun Wu Lin, Taichung (TW); Yu-Wen Wang, New Taipei (TW); Jian-Jou Lian, Tainan (TW); Shih Min Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/657,537

(22) Filed: Jul. 24, 2017

(65) Prior Publication Data

US 2018/0171226 A1 Jun. 21, 2018

Related U.S. Application Data

(60) Provisional application No. 62/434,740, filed on Dec. 15, 2016.

(51) Int. Cl.
| | |
|---|---|
| *H01L 21/3213* | (2006.01) |
| *H01L 29/66* | (2006.01) |
| *C09K 13/08* | (2006.01) |
| *C09K 13/02* | (2006.01) |

(52) U.S. Cl.
CPC .............. *C09K 13/02* (2013.01); *C09K 13/08* (2013.01); *H01L 21/32133* (2013.01); *H01L 29/66545* (2013.01); *H01L 29/66575* (2013.01)

(58) Field of Classification Search
None
See application file for complete search history.

(56) References Cited

U.S. PATENT DOCUMENTS

| | | | |
|---|---|---|---|
| 9,671,694 B1* | 6/2017 | Glodde | G03F 7/094 |
| 2012/0070995 A1* | 3/2012 | Wang | H01L 21/823842 438/705 |
| 2014/0151819 A1* | 6/2014 | Cheng | H01L 21/28255 257/411 |

FOREIGN PATENT DOCUMENTS

KR  10-2015002982 A  3/2015

* cited by examiner

*Primary Examiner* — Khaja Ahmad
(74) *Attorney, Agent, or Firm* — Sterne, Kessler, Goldstein & Fox, PLLC

(57) ABSTRACT

For a metal gate replacement integration scheme, the present disclosure describes removing a polysilicon gate electrode with a highly selective wet etch chemistry without damaging surrounding layers. For example, the wet etch chemistry can include one or more alkaline solvents with a steric hindrance amine structure, a buffer system that includes tetramethylammonium hydroxide (TMAH) and monoethanolamine (MEA), one or more polar solvents, and water.

20 Claims, 9 Drawing Sheets

WET ETCH CHEMISTRY FOR SELECTIVE SILICON ETCH

CROSS-REFERENCE TO RELATED APPLICATION

This application claims the benefit of U.S. Provisional Patent Application No. 62/434,740, titled "Wet Etch Chemistry for Selective Silicon Etch," filed on Dec. 15, 2016, which is incorporated by reference herein in its entirety.

BACKGROUND

In a replacement metal gate integration scheme, wet etch chemistries used for a polysilicon removal process can exhibit non-ideal etch selectivity between polysilicon and silicon oxide or between polysilicon and silicon nitride layers. A non-deal selectivity for the etching chemistry could mean that the surrounding materials will be etched or damaged during the polysilicon removal process, which can result in defects (e.g., particle generation, material diffusion, material degradation, etc.), electrical performance degradation (e.g., leakage current), and wafer yield loss.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
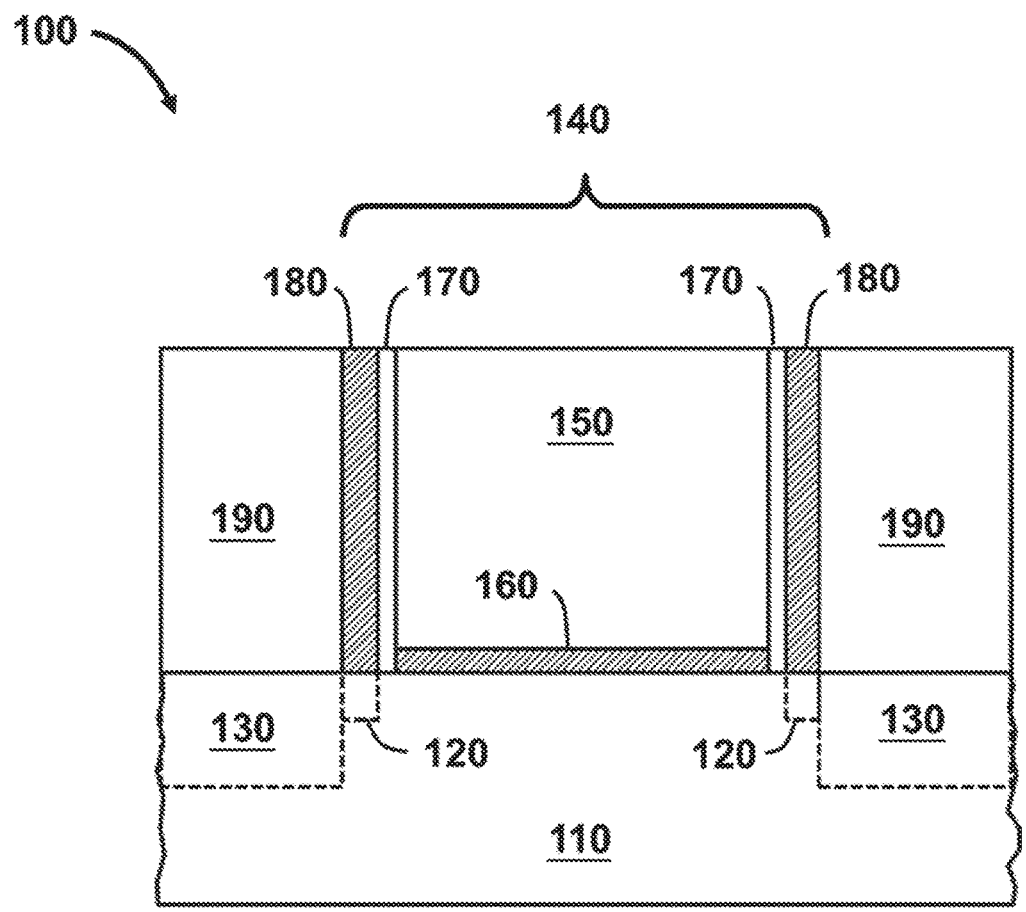
FIG. 1 shows an exemplary field effect transistor structure with a sacrificial polysilicon gate electrode, according to some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances. Unless defined otherwise, all technical and scientific terms used herein have the same meanings as commonly understood by one of ordinary skill in the art to which this disclosure belongs.

Wet etch is a process that uses a chemical solution, which contains liquid etchants, to remove materials from the surface of a target such as, for example, a wafer. A wet etch process can involve multiple chemical reactions that consume the original reactants and produce new reactants and byproducts. The wet etch process can be divided into three steps: (1) diffusion of the liquid etchant to the "target" material; (2) the reaction between the liquid etchant and the target material; and (3) diffusion of the byproducts in the solution, away from the surface where the reaction occurred.

A chemical solution property in such a wet etch process is the ability to remove the desired material without damaging, or attacking, other materials exposed to the wet etch chemistry. The etching system's ability to do this depends on the ratio of the etch rates between the target material and other material(s) present during the etching process. This etch rate ratio is known as "selectivity." Consequently, a wet etch process with "high" selectivity (e.g., greater than 1000 to 1) can remove the target material without damaging any other materials that are concurrently exposed to the wet etch chemistry. Conversely, a wet etch process with "low" selectivity (e.g., less than 1000 to 1) can remove the target material and at least part of any other material that is exposed to the wet etch chemistry.

Wet etch processes are used in chip manufacturing at various wafer fabrication stages to selectively remove materials from the wafer's surface. For example, wet etch can be used to remove polycrystalline silicon (polysilicon) from a sacrificial gate structure so that it can be replaced with a metal gate. Since the polysilicon is surrounded by other materials (e.g., silicon oxide, silicon nitride, and silicon carbon nitride), it is important to ensure that the wet etch chemistry has high selectivity towards polysilicon. If the selectivity is poor, the surrounding materials will be etched or damaged during the polysilicon removal process. Poor selectivity is undesirable and can result in defects (e.g., particle generation, material diffusion, material degradation, etc.), electrical performance degradation (e.g., leakage current), and wafer yield loss.

The present disclosure is directed to a wet etch chemistry which exhibits high selectivity for polysilicon and amorphous silicon (a-Si) materials and low selectivity for silicon-based oxides, nitrides, and oxycarbides. The wet etch chemistry can therefore remove polysilicon and a-Si without damaging any silicon oxide ($SiO_2$), silicon nitride ($Si_xN_y$), or silicon oxycarbide ($SiO_xC_y$) which are materials that may concurrently be exposed to the etching chemistry during the wet etch removal process. In some embodiments, this selective wet etch can be accomplished with the use of a co-solvent system (i.e., multiple solvents) in a semi-aqueous environment. That is, the selective wet etch chemistry can include at least two organic solvents (e.g., alkaline solvent and/or a polar solvent) and water. In some embodiments, the organic solvents can have a steric hindrance amine structure that can inhibit the reaction between the etching chemistry and materials such as $SiO_2$, $Si_xN_y$, or $SiO_xC_y$. In some embodiments, the wet etch chemistry can include a buffer system to ensure that the etch rate remains stable during the wet etch process. Further, small amounts of water or other bulk chemicals can be automatically introduced at predetermined intervals to replenish any consumed chemicals; therefore ensuring that the solution's pH and alkali concentration are stable.

FIG. 1 is a cross-sectional view of an exemplary field effect transistor (FET) structure 100, according to some embodiments. By way of example and not limitation, FET structure 100 can be a finFET or a planar transistor. Exemplary structure 100 includes a semiconductor substrate 110 with lightly doped regions 120 and heavily doped regions 130. Lightly doped regions 120 are known as lightly doped drain (LDD) regions or source/drain extensions. Heavily doped regions 130 are the source/drain regions or junctions of the FET as would be understood by a person of ordinary skill in the art.

If exemplary structure 100 is a planar transistor, then semiconductor substrate 110 can be a bulk wafer or the top layer of a semiconductor on insulator (SOI) wafer. If exemplary structure 100 is a finFET then semiconductor substrate 110 can be a semiconductor fin, which is perpendicular to the wafer's top surface. By way of example and not limitation, semiconductor substrate 110 can be made of silicon or another elementary semiconductor such as, for example, germanium; a compound semiconductor including silicon carbide, gallium arsenide (GaAs), gallium phosphide (GaP), indium phosphide(InP), indium arsenide (InAs), and/or indium antimonids (InSb); an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or combinations thereof.

Exemplary FET structure 100 also includes a gate structure 140. Gate structure 140 further includes a gate electrode 150, a gate dielectric 160, and first spacers 170 and second spacers 180. Gate electrode 150 and gate dielectric 160 are referred to as a "gate stack." As would be understood by a person of ordinary skill in the art, gate structure 140 can include a sacrificial gate electrode formed during a replacement gate process. In a replacement gate process, gate electrode 150 is a sacrificial gate electrode made of polysilicon that can be replaced with a metal gate electrode in subsequent operations. By way of example and not limitation, gate dielectric 160 is $SiO_2$, which can be replaced with a high dielectric constant (k value greater than 3.9) dielectric or a dielectric stack, such as hafnium oxide ($HfO_2$), hafnium silicate (Hf-silicate), $SiO_2/HfO_2$, or $SiO_2/Hf$-silicate. In some embodiments, first spacers 170 can be a dielectric material such as, for example, $SiO_2$, silicon oxynitride (SiON), carbon-doped silicon nitride (SiCN), $SiO_xC_y$, or $Si_xN_y$. In some embodiments, the thickness of first spacers 170 can range from about 2 nm to about 5 nm. In some embodiments, second spacers 180 can be made of a dielectric material such as, for example, SiON, $Si_xN_y$, or SiCN. As would be understood by a person of ordinary skill in the art, second spacer 180 can be a stack of one or more layers made of the same or different materials. The first spacers 170 and second spacers 180 can be used to define the lightly doped regions 120 and heavily doped region 130 and to provide structural support to the gate structure during the gate electrode/dielectric replacement process. It has to be noted that first spacers 170 and second spacers 180 are not removed during the polysilicon and $SiO_2$ removal process.

Interlayer dielectric (ILD) 190 abuts gate structure 140. In some embodiments, ILD 190 can be $SiO_2$, $SiO_xC$, SiON, silicon-oxy-carbon nitride (SiOCN), silicon carbide (SiC), SiCN, or a low-k material with a k value lower than 3.9. As would be understood by a person of ordinary skill in the art, ILD 190 provides electrical isolation to gate electrode 150 and the source/drain contacts that will be formed in future operations (not shown in FIG. 1).

In some embodiments, a combination of a dry and a wet etch processes can used to remove gate electrode 150, which by way of example and not limitation can be a polysilicon gate electrode. For example, a dry etch process can remove a portion of gate electrode 150 so that gate electrode 150 is recessed with respect to first/second spacers 170, 180, and ILD 190. An exemplary wet etch process, according to some embodiments, can then selectively remove any remaining material of gate electrode 150. If the wet etch process has poor selectivity for gate electrode 150 then, during the polysilicon removal process, first spacers 170 and gate dielectric 160 will be partially removed. As a result, the wet etch chemistry can reach substrate 110. Further, assuming substrate 110 is made of silicon, the wet etch chemistry can begin to etch through the silicon substrate 110, resulting in silicon loss. As explained earlier, silicon loss from substrate 110 is a reliability concern and can result in wafer yield loss.

Figure 2:
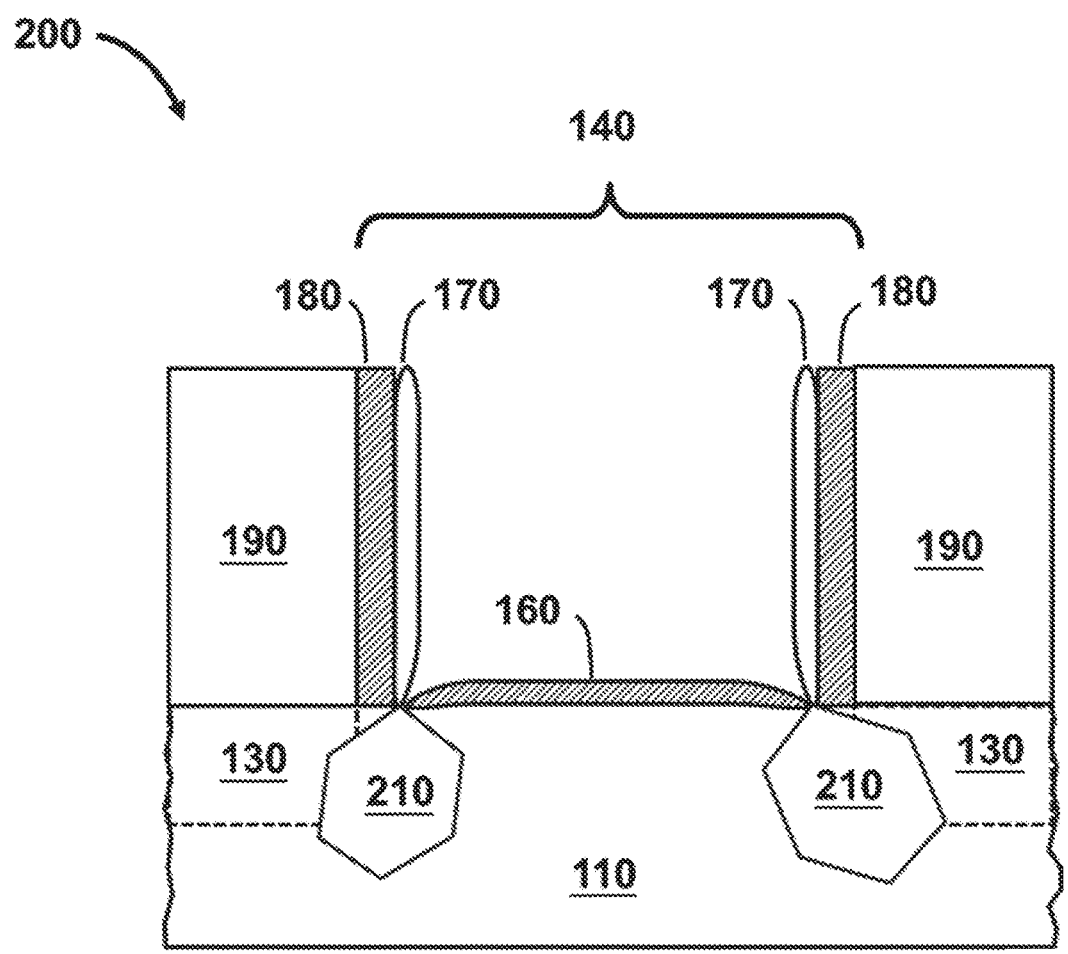
FIG. 2 shows an exemplary structure that has been subjected to a polysilicon wet etch process that exhibits poor polysilicon selectivity.

FIG. 2 shows an exemplary transistor structure 200 after the removal of the polysilicon gate electrode with a dry etch process and a subsequent wet etch process that exhibits poor etch selectivity between gate electrode 150, first spacers 170, and gate dielectric 160. In this exemplary case, first spacers 170 and gate dielectric 160 are etched substantially at "weak-point" locations where gate dielectric 160 and first spacer 170 could be thinner such as, for example, the bottom corners of gate structure 140. These weak-points can occur during deposition and can be attributed to the deposition technique, the geometrical characteristics of the structure (e.g., aspect ratio and opening profile), the thickness of each layer, and other parameters. As a result, portions of substrate 110 can be exposed to the wet etch chemistry, which can etch the exposed surfaces of substrate 110. Consequently, cavities 210 are formed in substrate 110 at the locations where the substrate and the wet etch chemistry come into contact. Since substrate 110 can be a single crystal material (e.g., silicon), the size and the shape of cavities 210 may vary depending on, for example, the etching time, crystallographic orientation of the substrate, doping level of the substrate, and mechanical stress. As would be understood by a person of ordinary skill in the art, cavities 210 can pose a serious reliability concern and lead to poor wafer yield. More importantly, cavities 210 can be random across the wafer and affect many areas of the chip.

An exemplary wet etch chemistry is disclosed herein to address the above issues. In some embodiments, the exemplary wet etch chemistry has the following attributes: (i) high selectivity to Si over Si-based oxides, nitrides and carbides; (ii) good wettability to reduce surface tension and allow the chemical solution to reach the targeted surfaces; and (iii) a buffer system to ensure the solution's strength (e.g., etching rate stability) is consistent over time.

With regard to selectivity, in some embodiments, the solution's selectivity can be tailored in two ways: (i) enhancing the polysilicon etch rate, and (ii) impeding the etch rate of other Si-based materials (e.g., Si-based oxides, nitrides, and carbides). In some embodiments, the polysilicon etch can be enhanced with the introduction of inorganic fluoride-based chemicals or inorganic alkalis such as hydrofluoric acid (HF) and ammonium hydroxide ($NH_4OH$). According to some embodiments, the addition of an organic alkali that features a steric hindrance amine structure can assist with the polysilicon etch and inhibit the etch of Si-based oxides, nitrides, and carbides. Therefore, the organic alkali that features a steric hindrance amine structure can have a dual function.

As would be understood by a person of ordinary skill in the art, steric hindrance is the prevention, or retardation, of inter- or intra-molecular interactions as a result of the spatial structure of a molecule. In other words, a steric hindrance amine structure can create a "layer" around the Si-based oxides, nitrides, and carbides to protect them from the etching components of the wet chemistry. The formation of this "protection layer" is attributed to the large size of the steric hindrance amine structure which prohibits the chemical solution from reaching and reacting with the Si-based oxides, nitrides, and carbides. In some embodiments, chemicals that possess a steric hindrance amine structure and could be used in an exemplary wet chemistry include tetramethyl ammonium hydroxide (TMAH), tetrabutylammonium hydroxide (TBAH), benzyltrimethylammonium hydroxide, and monoethanolamine (MEA). As would be understood by a person of ordinary skill in the art, the etching solution may contain more than one of the aforementioned steric hindrance amines. The steric hindrance amines can inhibit or retard the Si-based oxide, nitride, and carbide etch but continue to provide good etching rates for polysilicon or a-Si. Therefore, these organic alkalis can complement the inorganic etching chemicals and provide protection to the etching-sensitive layers of the structure.

In some embodiments, in addition to the organic alkalis with a steric hindrance structure, a polar solvent can also provide wet etch protection for gate dielectric 160, first spacers 170, second spacers 180 and ILD 190, which are Si-based oxide, nitride and carbide layers. Polar solvents can be organic or inorganic chemicals with atoms having different electronegativities. In some embodiments, the polar solvent can be organic solvents with high polarity, namely greater than 4. By way of example and not limitation, high polar organic solvents that can be added to the etching solution include sulfone derivatives, carbonate ester derivatives, ether derivatives, alcohol derivatives, and furan derivatives. In some embodiments, to protect silicon oxides and silicon nitrides, polar solvents that can be used include dimethyl sulfoxide, sulfolane, ethylene carbonate, tetrahydrofuran, butyl diglycol, and ethylene glycol (EG). As would be understood by a person of ordinary skill in the art, the aforementioned polar solvents are not intended to be limiting. The concentration ratio for the polar solvent in the etching solution can range from 1% to 40%, according to some embodiments.

With regard to wettability, in some embodiments, a surfactant can be used to improve the wettability of the solution on the surfaces of structure 100. Surfactants are compounds that lower the surface tension (or interfacial tension) between two liquids or between a liquid and a solid. Among other things, surfactants can be used as wetting agents. For example, fluorine-containing surfactants can be used according to some embodiments. In some embodiments, the use of a surfactant can be optional since some components of the wet etch chemistry—e.g., one of the organic solvents—may improve the solution's wettability. By way of example and not limitation, EG (which is a polar solvent that can be added to the organic solvent mixture to protect Si-based oxide, nitride, and carbide layers) can also improve the solution's wettability. In addition, EG does not participate in the reaction and forms hydrogen bonds with water in the solution. EG can therefore mitigate water loss during the etching process.

With regard to the buffer system, as the etching process progresses, the etching solution tends to lose its "strength" (etching ability) due to the consumption of its chemicals. In addition, the formation of byproducts, which are diluted into the etching solution, can also compromise its effectiveness over time. In some embodiments, a buffer system can mitigate these issues. As would be understood by a person of ordinary skill in the art, a buffer system is an aqueous solution that provides pH stability during the etching process regardless whether a base or an acid is added. According to some embodiments, the buffer system can provide hydroxide ($OH^-$) to the solution to sustain the chemical reactions and to retain the polysilicon etching selectivity. In addition, the buffer system can ensure that the polar solvents and the organic alkali solvents with steric hindrance amine structures continue to protect the Si-based oxide, nitride, and carbide layers. According to some embodiments, solvents that are already present in the solution can also act as a buffer system. By way of example and not limitation, TMAH and MEA are organic solvents that can be used as the solution's buffer system.

The solution's strength can also be maintained with a process known as "bulk chemical spiking." Spiking is a method during which small quantities of certain chemicals are replenished during the etch process. Chemicals that can be replenished are water, bulk chemicals like HF, and simple alkalis. In some embodiments, few milliliters of chemicals are added to the solution every 2 to 200 s. The spiking process can be automated and can be built into the wet etch recipe used by the wet etch equipment. Spiking can extend the lifetime of the etching solution and ensure consistent etching rate between wafers or between batches of wafers (lots). Extending the lifetime of the etching solution can significantly reduce the chip manufacturing cost. As would be understood by a person of ordinary skill in the art, a combination of a buffer system and spiking is possible for an exemplary wet etch process according to some embodiments.

Based on the above, in some embodiments, an exemplary wet etch chemistry can include at least the following components: a polar solvent, an alkaline solvent, a surfactant, and water. As would be understood by a person of ordinary skill in the art, the solution described above is a "semi-aqueous" system. In other words, the solution includes at least two organic solvents (e.g., a polar solvent and an alkaline solvent) dissolved in water.

In some embodiments, an exemplary polysilicon wet etch solution can include at least 40% MEA, at least 5% EG, no more than 1% TMAH, at least 10% water, and 0% surfactants. According to some embodiments, an exemplary wet etch solution with the aforementioned solvents and a solution temperature of 60° C. can have a polysilicon etch rate greater than 700 Å/min and a-Si etch rate greater than 200 Å/min. Meanwhile, the SiO$_2$ etch rate can be less than 0.03 Å/min, and the Si$_x$N$_y$ or SiO$_x$C$_y$ etch rate can be less than 0.110 Å/min. The aforementioned etch rates translate to the following etch selectivity ratios: for polysilicon to SiO$_2$, 26000:1 or greater; for polysilicon to Si$_x$N$_y$ (or SiO$_x$C$_y$) 6000:1 or greater; for a-Si to SiO$_2$, 9000:1 or greater; and for a-Si to Si$_x$N$_y$ (or SiO$_x$C$_y$), 2000:1 or greater. As would be understood by a person of ordinary skill in the art, the aforementioned combination of chemicals, their concentration percentages in the solution, and the resulting etch selectivity ratios for polysilicon and a-Si are not intended to be limiting and are provided only as an example. As a result, other chemical combinations, alternative concentrations and resulting etch selectivity ratios are possible.

According to some embodiments, the following reactions may occur during the etching process:

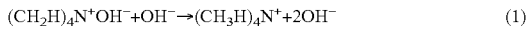   (1)

   (2a)

   (2b)

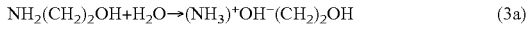   (3a)

   (3b)

Reaction (1) describes the TMAH dissociation to OH$^-$. Reactions (2a) and (2b) describe the conversion of solid (denoted as "$_{(s)}$" next to SiO$_2$ in reaction (2a)) SiO$_2$ by OH$^-$ to water-soluble silicate ions and water (reaction 2b). Finally, reactions (3a) and (3b) describe the MEA dilution in water after dissociation, supplemented with OH$^-$ from TMAH that maintain the stability of the etching solution. The buffer system (MEA and TMAH) provide the OH$^-$ groups for the TMAH dissociation in reaction (1). As would be understood by a person of ordinary skill in the art, reactions (1), (2a), 2(b), 3(a), 3(b) may not be executed in the order presented above and can be executed in a different order.

According to some embodiments, the chemicals of the etching solution are mixed inside the wet clean tool before the solution can be dispensed on the wafer. According to some embodiments, the wet etch chemistry is designed to work with single-wafer tools where the etching conditions can be tightly controlled. Examples of the etching conditions include the dispense angle of the solution with respect to the surface of the wafer, the etch time, the wafer temperature, and the solution temperature.

Figure 3:
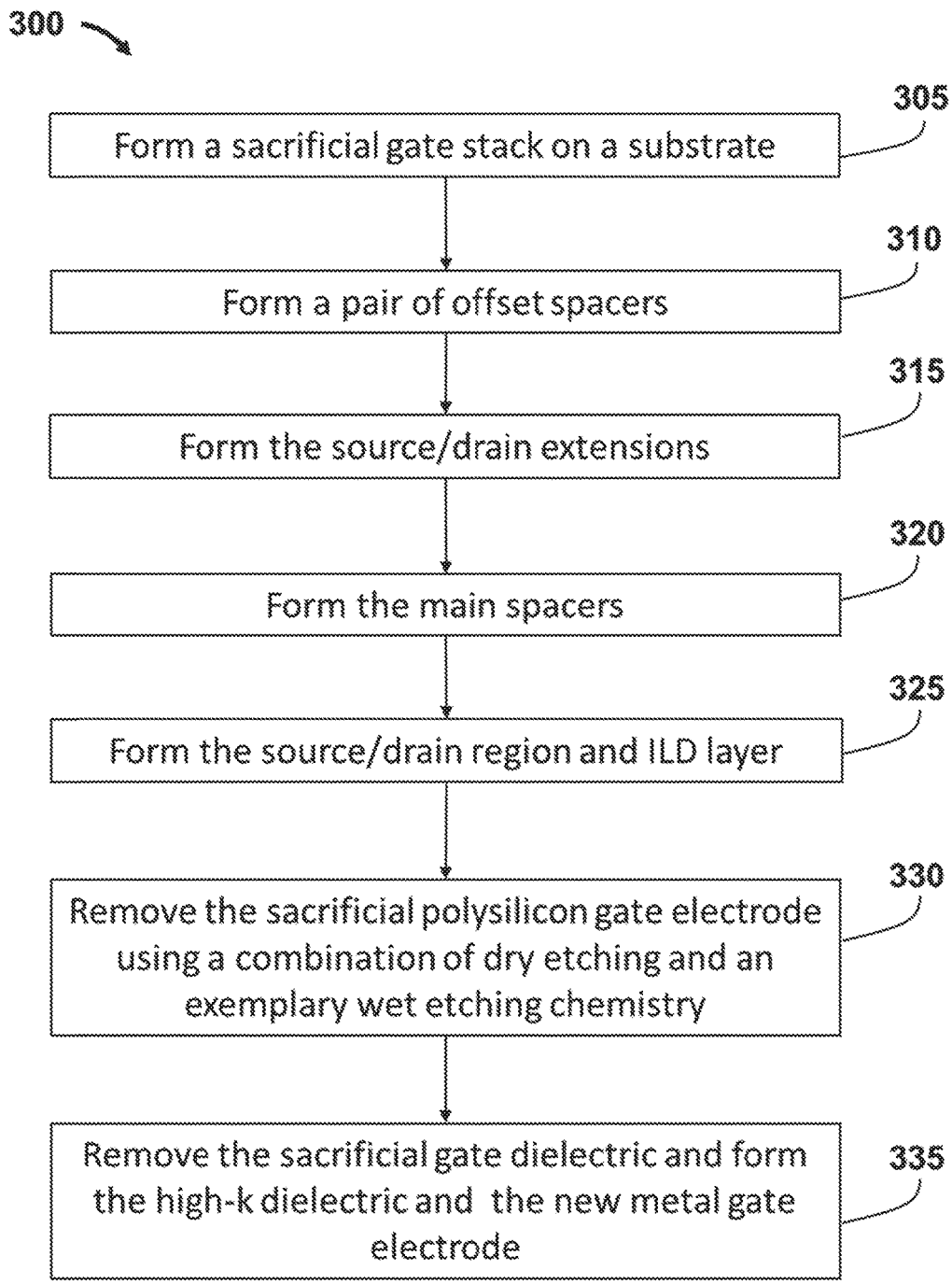
FIG. 3 shows a flow chart of an exemplary gate electrode replacement method that uses an exemplary wet etch chemistry to remove a sacrificial polysilicon gate electrode, according to some embodiments.

FIG. 3 shows a flow chart of an exemplary replacement gate process 300 that utilizes an exemplary wet etch chemistry for polysilicon gate electrode removal, according to some embodiments. Other fabrication operations may be performed between the operations of method 300 and are omitted merely for clarity. As would be understood by a person of ordinary skill in the art, the exemplary replacement gate process 300 is not limited to the operations described below.

Figure 4:
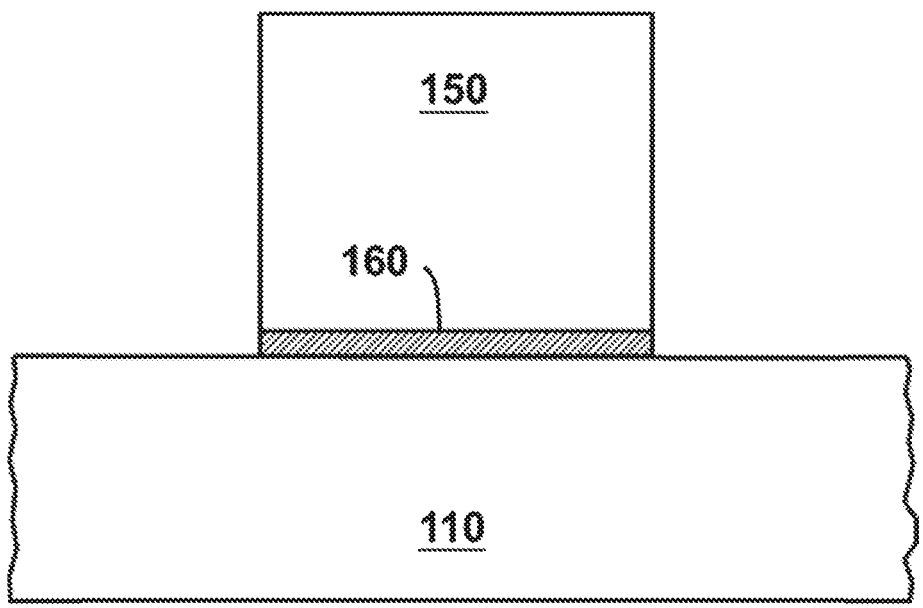
FIG. 4 shows an exemplary gate stack that includes a gate dielectric and a gate electrode, according to some embodiments.

Exemplary replacement gate process 300 starts with operation 305 where a sacrificial gate stack is formed on a substrate. The sacrificial gate structure can include a sacrificial gate electrode 150 and a sacrificial gate dielectric 160 as shown in FIG. 4. By way of example and not limitation, the sacrificial gate electrode 150 can be made of polysilicon, and the sacrificial gate dielectric 160 can be made of SiO$_2$. The gate stack can be formed, for example, with a blanket SiO$_2$ deposition followed by blanket polysilicon deposition. The resulting stack is then patterned using photolithography and etch operations. Semiconductor substrate 110 can be a bulk wafer or the top layer of an SOI wafer. If exemplary structure 100 is a finFET, then semiconductor substrate 110 can be a semiconductor fin that is perpendicular to the wafer's top surface. By way of example and not limitation, semiconductor substrate 110 can be made of silicon, another elementary semiconductor, or a compound semiconductor.

Figure 5:
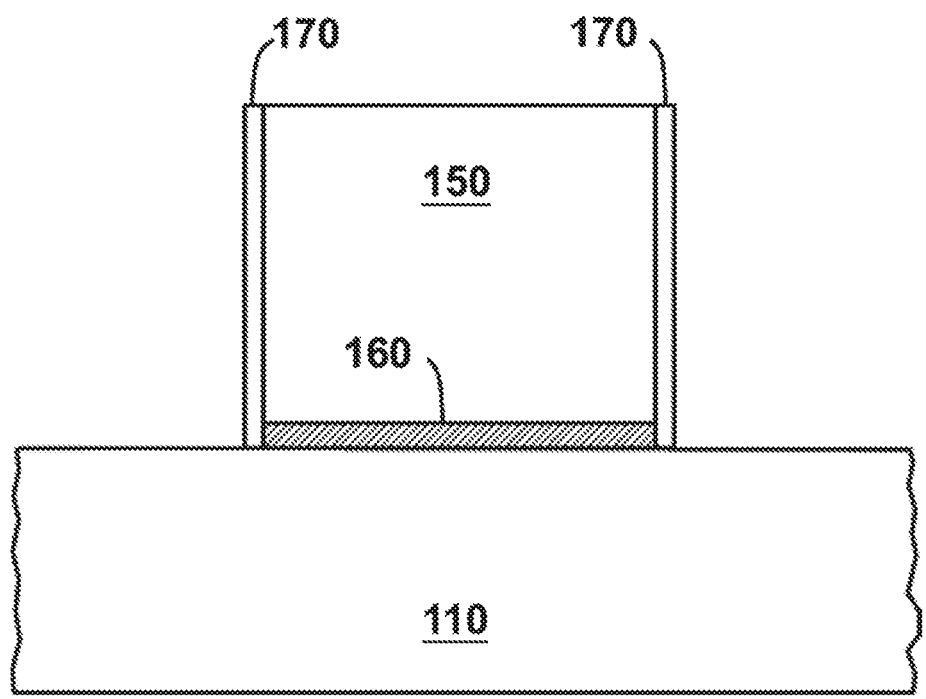
FIG. 5 shows an exemplary gate stack with first spacers, according to some embodiments.

In operation 310, a pair of first spacers 170 can be formed on the sidewalls of the gate stack as shown in FIG. 5. By way of example and not limitation, the spacer formation can include a blanket deposition of first spacer material that is uniformly deposited over all surfaces e.g., horizontal and vertical surfaces. An etch-back process can remove the blanket deposition on the horizontal surfaces such as the top surface of gate electrode 150 and substrate 110. The etch-back process can be anisotropic (e.g., single-direction) and can be automatically terminated when the gate electrode material is exposed. Consequently, at the end of the etch-back process, each sidewall surface of gate electrode 150 is covered with a layer of first spacer material. As would be understood by a person of ordinary skill in the art, first spacer 170 can be a dielectric material such as, for example, SiO$_2$, SiON, SiCN, SiO$_x$C$_y$, or Si$_x$N$_y$. In some embodiments, the thickness of first spacers 170 can range from about 2 to about 5 nm.

Figure 6:
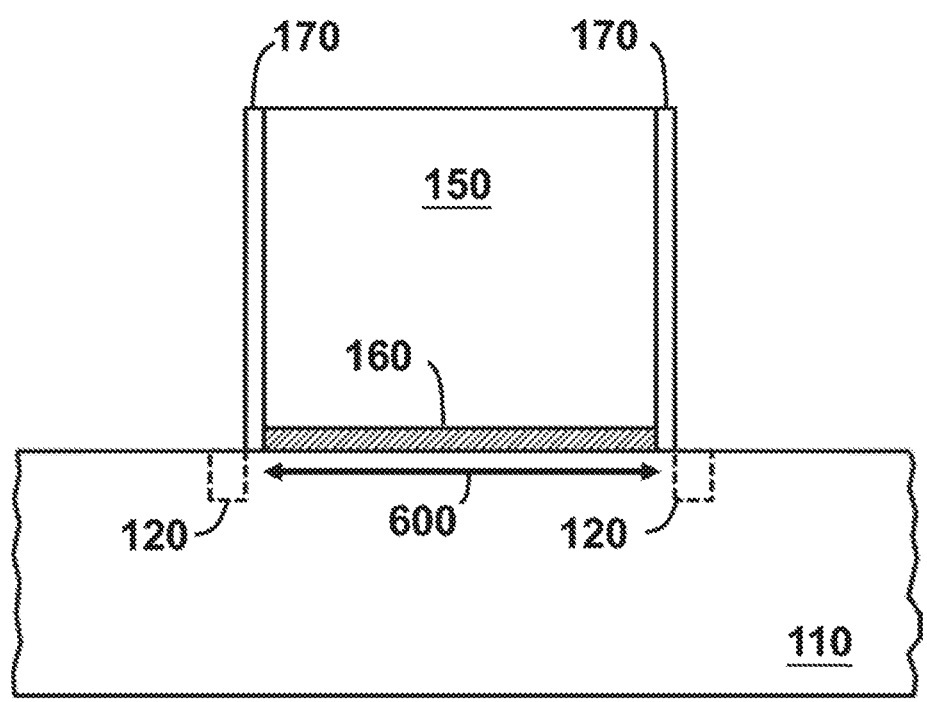
FIG. 6 shows an exemplary gate stack with first spacers and source/drain extensions, according to some embodiments.

In operation 315, the first spacers 170 and gate electrode 150 can be used as an implant mask to form source/drain extensions (or LID) implants. Such implants can be p-type or n-type. By way of example and not imitation, boron can be used as a p-type implant and arsenic, phosphorous, or antimony can be used as an n-type implant. The source/drain extension regions 120 as shown in FIG. 6 are placed at a close proximity to the edge of the channel region 600 (underneath the gate stack), as defined by the thickness of first spacers 170, to provide a gradual dopant concentration to the source/drain regions which will be formed in operation 325. The source/drain extensions create lateral and vertical doping profiles in the interface region of the channel edge. As would be understood by a person of ordinary skill in the art, the source/drain extensions mitigate high electric fields that may be present between the source/drain regions and channel region 600 during transistor operation.

Figure 7:
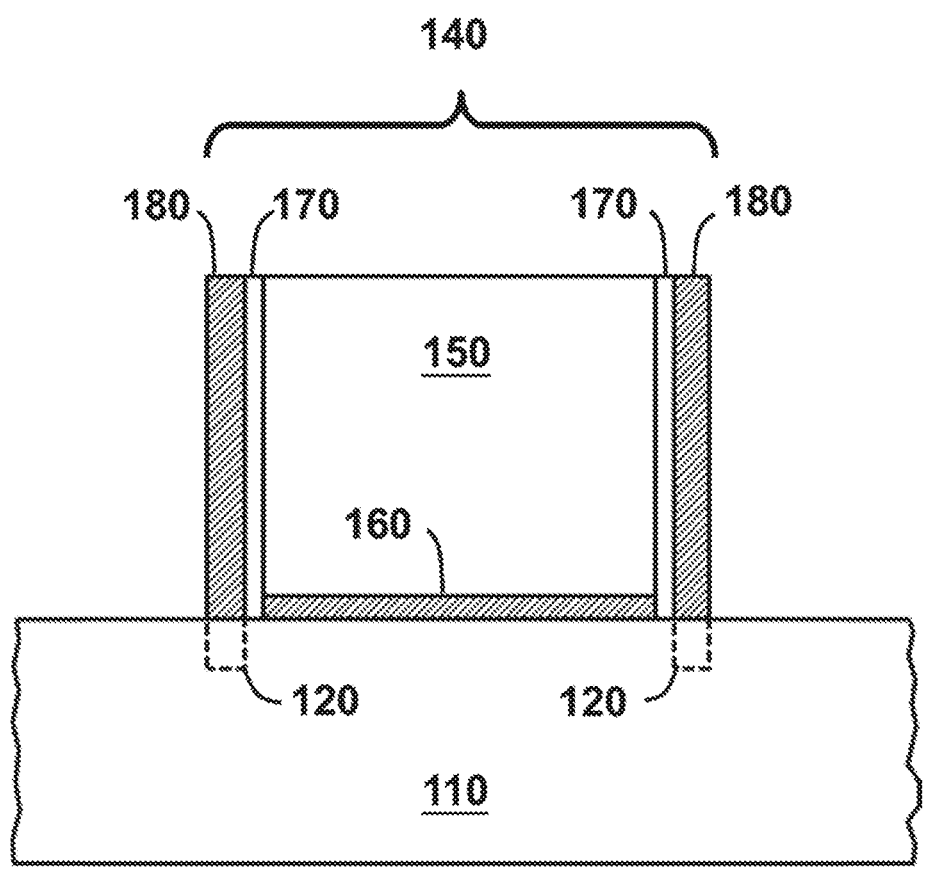
FIG. 7 shows an exemplary gate stack with first spacers, source/drain extensions, and second spacers, according to some embodiments.

Exemplary process 300 continues with operation 320 where second spacers 180 as shown in FIG. 7 can be formed. Second spacers 180 can be formed in a similar manner as first spacers 170—e.g., with a blanket deposition of the second spacer material and an etch-back process. In some embodiments, second spacers 180 can be made of a dielectric material such as, for example, SiON, Si$_x$N$_y$, or SiCN. As would be understood by a person of ordinary skill in the art, second spacers 180 can be a stack of one or more layers made of the same or different materials.

Figure 8:
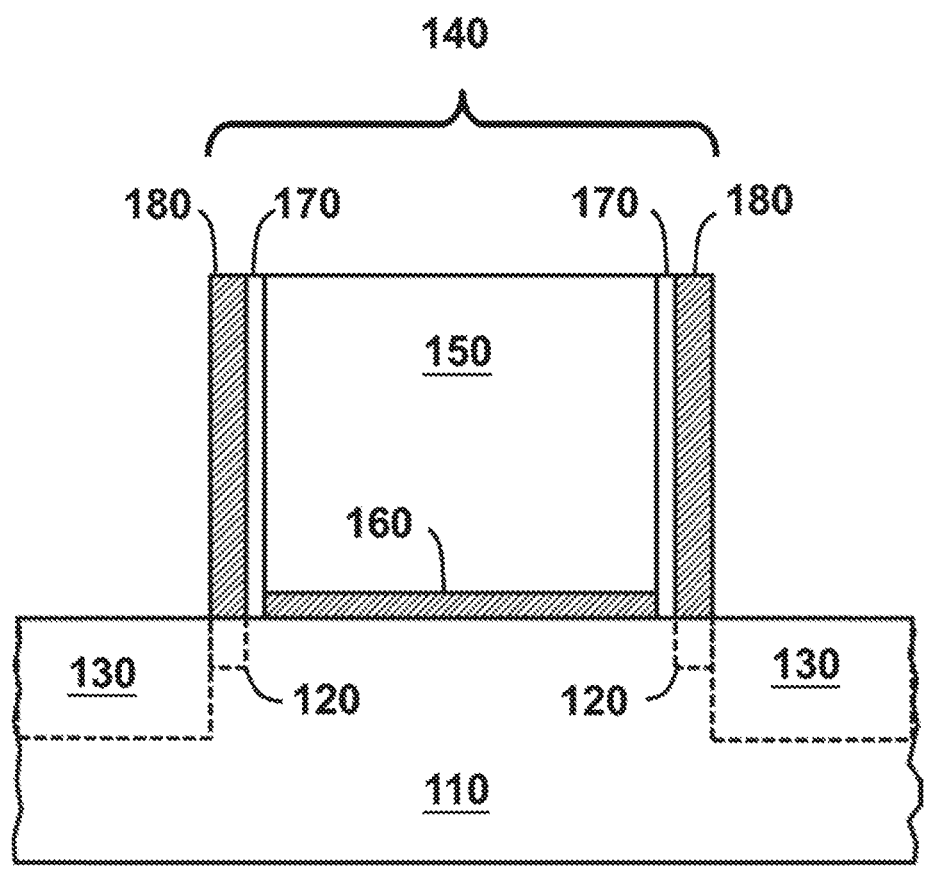
FIG. 8 shows an exemplary gate stack with first spacers, source/drain extensions, second spacers, and source/drain regions, according to some embodiments.

In operation 325, the gate stack, the first spacers 170 and second spacers 180 can be used as a mask for the main implants to form the source/drain regions 130 as shown in FIG. 8. Source/drain regions 130 are heavily doped regions that have higher dopant concentrations and are larger in size than source/drain extensions 120. Regions 130 and 120 are required to have the same type and kind of dopants. After the source/drain region 130 formation, an ILD layer can be formed to electrically isolate gate stack 140. By way of example and not limitation, the ILD formation can begin with a blanket deposition of ILD material over substrate 110 and gate stack 140. A chemical mechanical planarization (CMP) process can be used to remove excess ILD material and to planarize it so that the top surface of the ILD material and the top surface of gate stack 140 are aligned. FIG. 1 shows the resulting structure where ILD layer 190 abuts the sidewall surfaces of gate stack 140. In some embodiments, ILD 190 can be $SiO_2$, SiOC, SiON, SiOCN, SiC, or SiCN.

Figure 9:
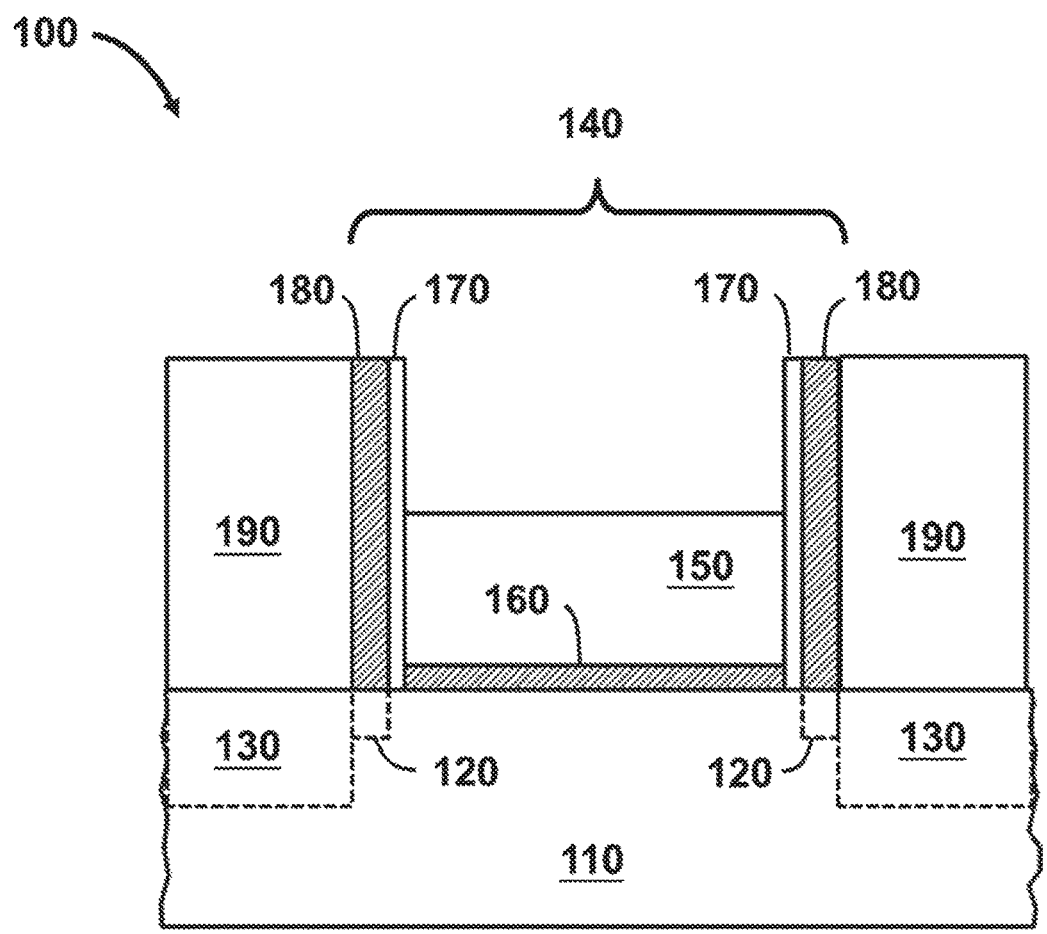
FIG. 9 shows an exemplary gate stack with a recessed gate electrode after a dry etch process, according to some embodiments.

In operation 330, the sacrificial polysilicon gate electrode 150 can be removed. In some embodiments, sacrificial polysilicon gate electrode 150 can be removed in a two-step process. For example, in a first step, a portion of the sacrificial polysilicon gate electrode 150 can be removed with a dry etch process. And in a second step, sacrificial polysilicon gate electrode 150 can be removed with an exemplary wet etch process. By way of example and not limitation, the dry etch process can recess the sacrificial polysilicon gate electrode 150 with respect to first spacers 170, second spacers 180, and ILD 190 as shown in FIG. 9. By way of example and not limitation, the exemplary wet etch process can selectively remove polysilicon without substantially removing first spacer 170 and gate dielectric 160.

According to some embodiments, the exemplary wet etch chemistry can include at least a polar solvent, an alkaline solvent, an optional surfactant, and water. In some embodiment, the wet etch chemistry has the following attributes: (i) high selectivity to Si over Si-based oxides, nitrides, and carbides; (ii) good wettability to reduce surface tension and allow the chemical solution to reach the targeted surfaces; and (iii) a buffer system to ensure that the solution's strength (e.g., etching rate stability) is consistent over time.

In some embodiments, selectivity can be tailored in two ways: (i) by enhancing the polysilicon etch rate; and (ii) by impeding the etch rate of other Si-based materials (e.g., Si-based oxides, nitrides, and carbides). In some embodiments, the polysilicon etch can be enhanced with the introduction of inorganic fluoride-based chemicals or inorganic alkalis such as HF and $NH_4OH$. According to some embodiments, the addition of an organic alkali that features a steric hindrance amine structure can assist with the polysilicon etch and inhibit the etch of Si-based oxides, nitrides, and carbides. Therefore, these organic alkalis can complement the inorganic etching chemicals and provide protection to the etching-sensitive layers of the structure. By way of example and not limitation, chemicals that possess a steric hindrance amine structure and can be used in the exemplary wet chemistry include TMAH, TBAH, benzyltrimethylammonium hydroxide, or MEA.

In addition to the organic alkalis with a steric hindrance amine structure, a polar solvent can also provide wet etch protection for gate dielectric 160, first spacers 170, second spacers 180 and ILD 190 (e.g., Si-based oxide, nitride, and carbide layers). In some embodiments, the polar solvent selection can be organic solvents with high polarity, namely greater than 4. By way of example and not limitation, high polar organic solvents that can be added to the etching solution include sulfone derivatives, carbonate ester derivatives, ether derivatives, alcohol derivatives, and furan derivatives. To protect $SiO_2$ and $Si_xN_y$, polar solvents that can be used include dimethyl sulfoxide, sulfolane, ethylene carbonate, tetrahydrofuran, butyl diglycol, and EG. As would be understood by a person of ordinary skill in the art, the aforementioned polar solvents are not intended to be limiting and the concentration ratio for the polar solvent in the solution can range from 1% to 40%.

Wettability of the etching solution on the surfaces of structure 100 of FIG. 1 can be improved with the use of a surfactant. Fluorine-containing surfactants can be used according to some embodiments. In some embodiments, the use of a surfactant is optional since some components of the wet etch chemistry—e.g., one of the organic solvents—may improve the solution's wettability. By way of example and not limitation, EG (which is a polar solvent that can be added to the organic solvent mixture to protect Si-based oxide, nitride, and carbide layers) can also improve the solution's wettability. In addition, EG does not participate in the reaction and forms hydrogen bonds with water in the solution. It can therefore mitigate water loss during the etching process.

A buffer system can ensure that the etching solution retains its strength or etching ability. For example, byproducts that are diluted into the solution, can compromise the solution's etching ability over time. As would be understood by a person of ordinary skill in the art, a buffer system is a semi-aqueous solution that provides pH stability during the etching process regardless whether a base or an acid is added. According to some embodiments, the buffer system can provide OH⁻ to the solution to sustain the chemical reactions and retain the polysilicon etching selectivity. The buffer system can also ensure that the polar solvents and the organic alkali solvents with steric hindrance amine structures continue to protect the Si-based oxide, nitride, and carbide layers. According to some embodiments, solvents that are already present in the solution can also act as a buffer system. By way of example and not limitation, TMAH and MEA are organic solvents that can function as the solution's buffer system.

The solution's strength can also be maintained by bulk chemical spiking, as described above. Chemicals that can be replenished are water, bulk chemicals like HF, and simple alkalis. In some embodiments, few milliliters of chemicals are added to the solution every 2 to 200 s. Spiking can extend the lifetime of the etching solution and ensure consistent etching rate between wafers or between lots. Extending the lifetime of the etching solution can reduce the chip manufacturing cost. A combination of a buffer system and spiking can be used in the exemplary wet etch solution, according to some embodiments.

In some embodiments, the exemplary polysilicon wet etch solution can include at least 40% MEA, at least 5% EG, no more than 1% TMAH at least 10% water, and 0% surfactants. According to some embodiments, an exemplary wet etch solution with the aforementioned solvents and a solution temperature of 60° C. can have a polysilicon to $SiO_2$ etch selectivity ratio greater than 26000:1, a polysilicon to $Si_xN_y$ (or $SiO_xC_y$) etch selectively ratio greater than 6000:1; an a-Si to $SiO_2$ etch selectivity ratio greater than 9000:1, and a-Si to $Si_xN_y$ (or $SiO_xC_y$) etch selectivity ratio greater than 2000:1. As would be understood by a person of ordinary skill in the art, the aforementioned combination of chemicals, their concentration percentages in the solution, and the resulting etch selectivity ratios are not intended to be limiting and are provided only as an example. Consequently, other solvent combinations, alternative concentrations and resulting etch selectivity ratios are possible for the wet etch solution.

In operation 335 of exemplary process 300, the remaining sacrificial gate dielectric layer 160 can be removed with a wet etch and can be replaced with a high-k dielectric such as, for example, $HfO_2$, Hf-silicate, or a stack of dielectric materials. The stack of dielectric materials can be, for example, $SiO_2/HfO_2$, silicon oxynitride/$HfO_2$ or $SiO_2$/Hf-silicate, silicon oxynitride/Hf-silicate, or any other combination of suitable high-k dielectrics. The metal gate electrode can be different depending on the type of transistor (p-type or n-type) and the work function requirement for each. Exemplary p-type work function metals that may be included in the metal gate structure include titanium nitride (TiN), tantalum nitride (TaN), ruthenium (Ru), molybdenum (Mo), aluminum (Al), tungsten nitride (WN), zirconium silicide ($ZrSi_2$), molybdenum silicide ($MoSi_2$), tantalum silicide ($TaSi_2$), nickel silicide ($NiSi_2$), tungsten nitride (WN), other suitable p-type work function materials, or combinations thereof. Exemplary n-type work function metals that may be included in the metal gate structure include titanium (Ti), silver (Ag), tantalum-aluminum alloy (TaAl), tantalum-aluminum carbide (MAW), tantalum-aluminum nitride (TiAlN), tantalum carbide (TaC), tantalum carbon nitride (TaCN), tantalum silicon nitride (TaSiN), manganese (Mn), zirconium (Zr), other suitable n-type work function metals/alloys, or combinations thereof. By way of example and not limitation, the gate electrode dielectric and metal gate electrode can be deposited with atomic layer deposition (ALD), chemical vapor deposition (CVD), or any other suitable deposition process.

The present disclosure is directed to an exemplary wet etch chemistry that exhibits selectivity ratios greater than 2000:1 for polysilicon and a-Si over $SiO_2$, $Si_xN_y$, and $SiO_xC_y$. In some embodiments, this can be accomplished with the use of a semi-aqueous solution with a co-solvent system. The co-solvent system includes of at least two organic solvents, an alkaline solvent, and a polar solvent. An advantage of this approach is that the co-solvent system is configured so that the alkaline and polar solvent combination can fulfill different aspects of the solution simultaneously. For example, protection for $SiO_2$, $Si_xN_y$, or $SiO_xC_y$ can be achieved with the use of an organic alkaline solvent that features a steric hindrance amine structure and a polar solvent with polarity greater than 4. At the same time, a polar solvent such as EG can improve the wettability of the etching solution, and the combination of TMAH and MEA (organic alkaline solvent that features a steric hindrance amine structure) can operate as a buffer system. Another advantage of the exemplary wet etch chemistry is the ability to use spiking which can extend the lifetime of the solution.

In some embodiments, a wet etch chemistry includes: one or more alkaline solvents with a steric hindrance amine structure; a buffer system that includes tetramethylammonium hydroxide (TMAH) and monoethanolamine (MEA); one or more polar solvents; and water.

In some embodiments, a semiconductor fabrication method includes a gate stack structure with a polysilicon gate electrode is formed over a gate dielectric with a dielectric layer abutting the side surfaces of the gate stack structure. The polysilicon gate electrode is selectively removed with a wet etch chemistry, where the wet etch chemistry includes one or more alkaline solvents—with at least one of the alkaline solvents having a steric hindrance amine structure—and one or more polar solvents having a polarity greater than 4.

In some embodiments, a wet etch chemistry, that can selectively etch polysilicon or amorphous silicon in a gate replacement process, includes: an inorganic fluoride-based chemical or an inorganic alkali; one or more organic alkaline solvents with a steric hindrance amine structure; one or more polar solvents; and water.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wet etch chemistry comprising:
   one or more alkaline solvents, wherein at least one of the alkaline solvents comprises a steric hindrance amine structure;
   a buffer system comprising tetramethylammonium hydroxide (TMAH) and monoethanolamine (MEA);
   one or more polar solvents; and
   water.

2. The wet etch chemistry of claim 1, wherein the one or more polar solvents have a polarity greater than 4.

3. The wet etch chemistry of claim 1, further comprising:
   an inorganic fluoride-based chemical or an inorganic alkali.

4. The wet etch chemistry of claim 3, wherein the inorganic fluoride-based chemical and the inorganic alkali comprise hydrofluoric acid (HF) and ammonium hydroxide ($NH_4OH$), respectively.

5. The wet etch chemistry of claim 1, wherein the wet etch chemistry comprises a semi-aqueous system comprising monoethanolamine (MEA), ethylene glycol (EG), tetramethylammonium hydroxide (TMAH), water, and a fluorine-containing surfactant, and wherein a polysilicon to silicon oxide selectivity ratio can be greater than 26000:1 and a polysilicon to silicon nitride ($Si_xN_y$) selectivity ratio or a polysilicon to silicon oxy-carbide ($SiO_xC_y$) selectivity ratio can be greater than 6000:1.

6. The wet etch chemistry of claim 1, wherein the at least one of the alkaline solvents having the steric hindrance amine structure comprises tetramethylammonium hydroxide (TMAH), tetrabutylammonium hydroxide (TBAH), benzyltrimethylammonium hydroxide, or monoethanolamine (MEA).

7. The wet etch chemistry of claim 1, wherein the one or more polar solvents comprise sulfone derivatives, carbonate ester derivatives, ether derivatives, alcohol derivatives, furan derivatives, dimethyl sulfoxide, sulfolane, ethylene carbonate, tetrahydrofuran, butyl diglycol, and ethylene glycol (EG).

8. A wet etch chemistry to selectively etch polysilicon or amorphous silicon in a gate replacement process, the wet etch chemistry comprising:
   an inorganic fluoride-based chemical or an inorganic alkali;
   one or more organic alkaline solvents, with at least one of the alkaline solvents having a steric hindrance amine structure;
   one or more polar solvents; and
   water.

9. The wet etch chemistry of claim 8, wherein the at least one alkaline solvents having the steric hindrance amine structure comprises tetramethylammonium hydroxide (TMAH), tetrabutylammonium hydroxide (TBAH), benzyltrimethylammonium hydroxide, or monoethanolamine (MEA).

10. The wet etch chemistry of claim 8, wherein the one or more polar solvents have a polarity greater than 4 and comprise sulfone derivatives, carbonate ester derivatives, ether derivatives, alcohol derivatives, furan derivatives, dimethyl sulfoxide, sulfolane, ethylene carbonate, tetrahydrofuran, butyl diglycol, and ethylene glycol (EG).

11. The wet etch chemistry of claim 8, wherein the inorganic fluoride-based chemical and the inorganic alkali comprise hydrofluoric acid (HF) and ammonium hydroxide ($NH_4OH$), respectively.

12. The wet etch chemistry of claim 8, further comprising:
a buffer system comprising tetramethylammonium hydroxide (TMAH) and monoethanolamine (MEA).

13. A wet etch chemistry solution to selectively etch polysilicon or amorphous silicon in a gate replacement process, the wet etch chemistry solution comprising:
alkaline solvents, polar solvents, or combinations thereof, wherein at least one of the alkaline solvents comprises a steric hindrance amine structure and the polar solvents have a polarity greater than 4;
an inorganic fluoride based chemical or an inorganic alkali;
a buffer system comprising tetramethylammonium hydroxide (TMAH) and monoethanolamine (MEA); and
a fluorine-containing surfactant.

14. The wet etch chemistry solution of claim 13, wherein a concentration of the polar solvents ranges from 1% to 40%.

15. The wet etch chemistry solution of claim 13, wherein the polar solvents comprise sulfone derivatives, carbonate ester derivatives, ether derivatives, alcohol derivatives, furan derivatives, dimethyl sulfoxide, sulfolane, ethylene carbonate, tetrahydrofuran, butyl diglycol, and ethylene glycol (EG).

16. The wet etch chemistry solution of claim 13, wherein the at least one of the alkaline solvents comprises tetrabutylammonium hydroxide (TBAH).

17. The wet etch chemistry solution of claim 13, wherein the MEA is at least 40% of the wet etch chemistry, an ethylene glycol (EG) is at least 5% of the wet chemistry, and the TMAH is less than 1% of the wet etch chemistry.

18. The wet etch chemistry solution of claim 13, further comprising at least 10% water.

19. The wet etch chemistry solution of claim 13, wherein the at least one of the alkaline solvents comprises tetrabutylammonium hydroxide (TBAH).

20. The wet etch chemistry solution of claim 13, wherein the inorganic fluoride-based chemical and the inorganic alkali comprise hydrofluoric acid (HF) and ammonium hydroxide ($NH_4OH$), respectively.

* * * * *